US009588888B2

(12) United States Patent
Nickel et al.

(10) Patent No.: US 9,588,888 B2
(45) Date of Patent: Mar. 7, 2017

(54) MEMORY DEVICE AND METHOD FOR ALTERING PERFORMANCE CHARACTERISTIC BASED ON BANDWIDTH DEMAND

(75) Inventors: Janice H. Nickel, Sunnyvale, CA (US); Gilberto Ribeiro, Menlo Park, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 1714 days.

(21) Appl. No.: 12/847,907

(22) Filed: Jul. 30, 2010

(65) Prior Publication Data

US 2012/0030434 A1 Feb. 2, 2012

(51) Int. Cl.
*G06F 12/00* (2006.01)
*G11C 13/00* (2006.01)
*G06F 12/08* (2016.01)

(52) U.S. Cl.
CPC ...... *G06F 12/0802* (2013.01); *G11C 13/0002* (2013.01); *G11C 13/0007* (2013.01); *G11C 13/0069* (2013.01); *G06F 2212/2024* (2013.01); *G06F 2212/601* (2013.01); *G11C 2213/77* (2013.01)

(58) Field of Classification Search
CPC .......... G06F 12/0802; G06F 2212/601; G06F 2212/2024; G11C 13/0069; G11C 13/0007;

(Continued)

(56) References Cited

U.S. PATENT DOCUMENTS 5,860,106 A * 1/1999 Domen et al. ................ 713/324
6,219,752 B1 4/2001 Sekido
(Continued)

FOREIGN PATENT DOCUMENTS

JP 11297086 A 10/1999

OTHER PUBLICATIONS

Vontobel et al, "Writing to and Reading from a Nano-scale Crossbar Memory Based on Memristors," Nanotechnology, Issue 42 (Oct. 21, 2009), received May 15, 2009 (in final form Aug. 24, 2009), published Sep. 25, 2009, pp. 1-21.*

(Continued)

*Primary Examiner* — Mark Giardino, Jr.
*Assistant Examiner* — Glenn Gossage
(74) *Attorney, Agent, or Firm* — Fabian VanCott

(57) ABSTRACT

A memory device and method for altering a performance characteristic of a memory array to increase a rate at which the memory device writes data in response to the memory device experiencing a demand for bandwidth above a threshold. The memory device may include a memory controller and a memory array, which may include memristive memory elements. To alter a performance characteristic, for example, the memristive memory elements may be written at sub-full resistive states which have a smaller difference between high and low resistive states, and/or the memory controller may disable a subset of memory elements and/or memory cells along a bit line and/or word line of the memory array. The subset of memory elements may be re-enable in response to the demand for bandwidth falling below the threshold, and data may be moved and/or rearranged within the memory device when the subset of memory elements is re-enabled. Altering the performance characteristic may increase a rate at which the memory device writes data.

9 Claims, 6 Drawing Sheets

(58) Field of Classification Search
CPC .......... G11C 13/0004; G11C 13/0002; G11C 2213/77
See application file for complete search history.

(56) References Cited

U.S. PATENT DOCUMENTS

| | | | |
|---|---|---|---|
| 7,143,203 B1 * | 11/2006 | Altmejd | 710/16 |
| 7,426,649 B2 | 9/2008 | Brittain et al. | |
| 7,489,570 B2 * | 2/2009 | Kim et al. | 365/198 |
| 7,664,617 B2 | 2/2010 | Greco et al. | |
| 7,716,334 B2 | 5/2010 | Rao et al. | |
| 7,924,601 B2 * | 4/2011 | Aoki | 365/148 |
| 8,045,363 B2 * | 10/2011 | Kim | 365/148 |
| 2009/0276567 A1 | 11/2009 | Burkey | |
| 2012/0131278 A1 * | 5/2012 | Chang et al. | 711/118 |

OTHER PUBLICATIONS

Ho et al, "Nonvolatile Memristor Memory: Device Characteristics and Design Implications," IEEE/ACM International Conference on Computer-Aided Design (ICCAD), Digest of Technical Papers, Nov. 2-5, 2009, pp. 485-490.*

Huang et al, "Memristor System Properties and Its Design Applications to Circuits Such as Nonvolatile Memristor Memories," International Conference on Communications, Circuits and Systems (ICCCAS), Jul. 28-30, 2010, pp. 805-810.*

Williams, "How We Found the Missing Memristor," IEEE Spectrum, Dec. 2008, pp. 29-35.*

* cited by examiner

600

In response to a memory device experiencing a demand for bandwidth above a threshold, write memory elements of the memristive memory device at lower resistive state levels than standard resistive state levels used to represent data on the memory device
(block 602)

In response to the memory device experiencing a demand for bandwidth above a threshold, disable a subset of bits along a word line by setting the subset of bits in a high resistive state, the subset of bits on a far end of the word line
(block 604)

In response to the demand for bandwidth falling below the threshold, rewrite the memory elements which were written at the low resistive state levels to the standard resistive state levels
(block 606)

In response to the demand for bandwidth falling below the threshold, enable the subset of bits along the word line
(block 608)

*Fig. 6*

MEMORY DEVICE AND METHOD FOR ALTERING PERFORMANCE CHARACTERISTIC BASED ON BANDWIDTH DEMAND

STATEMENT OF GOVERNMENT INTEREST

This invention has been made with government support. The government has certain rights in the invention.

BACKGROUND

Computing systems typically include multiple types of memory, each type of memory being used for different purposes. For example, main memory is often made of a volatile type of memory. Volatile memory loses its data when power is interrupted. However, volatile memory devices are typically able to operate at higher speeds than non-volatile memory. Non-volatile forms of memory are able to retain their data when no power is supplied. However, non-volatile memory devices typically operate at much lower speeds than volatile memory. Particularly, the speed at which data can be written to non-volatile memory devices is relatively slow. Thus, non-volatile memory devices are typically used for long term storage.

BRIEF DESCRIPTION OF THE DRAWINGS

The accompanying drawings illustrate various embodiments of the principles described herein and are a part of the specification. The illustrated embodiments are merely examples and do not limit the scope of the claims.

FIG. 6 is a flowchart showing an illustrative method of adjusting the performance characteristics of a storage device, according to one example of principles described herein.

Throughout the drawings, identical reference numbers designate the same elements or parts, but these elements or parts need not be identical.

DETAILED DESCRIPTION

Figure 1:
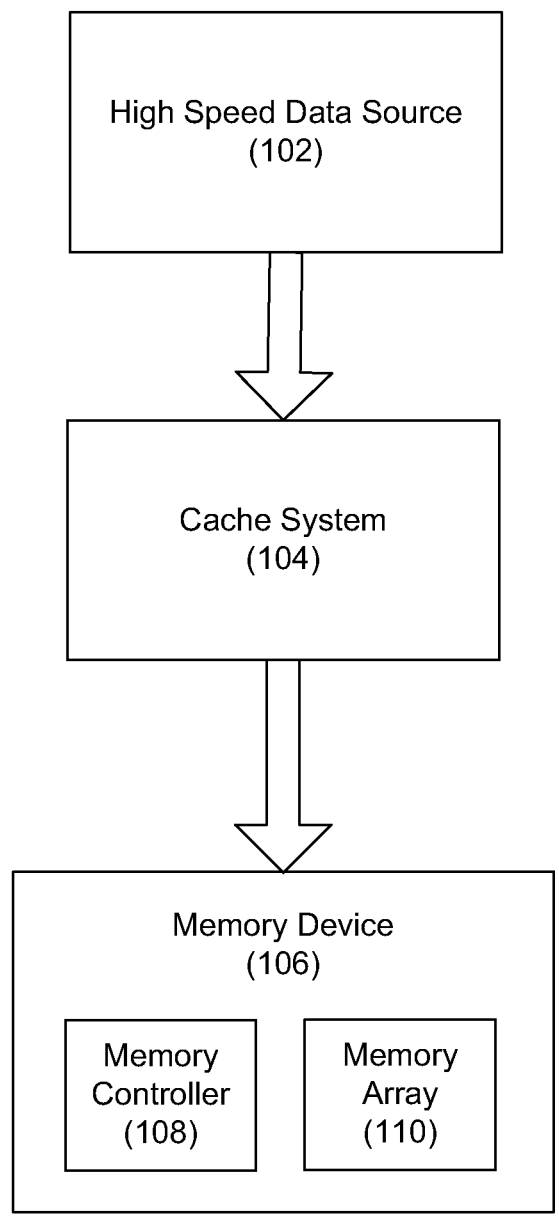
FIG. 1 is a diagram showing an illustrative memory system, according to one example of principles described herein.

When transferring data between a memory device that operates at higher speeds to a memory device that operates at lower speeds, it is inefficient to slow down the performance of the higher speed device. For example, when data is being transferred from a high speed volatile memory device to a low speed non-volatile memory device, it would be inefficient to slow the volatile memory device down to the writing speed of the non-volatile memory device. To prevent such inefficiency, cache systems are often used as a buffer to temporarily store the data being transferred from the high speed memory device to the low speed memory device. The buffer allows the high speed memory device to continue to output the data at high speeds. This data accumulates in the buffer and is written from the buffer to the lower speed memory device at the rate which the lower speed memory device is able to handle.

During periods when the bandwidth demanded of the slower speed memory device is high, more data accumulates in the buffer of the cache system. Bandwidth refers to the amount of data being transferred to and from a memory device within a specified period of time. Particularly, when a lot of data from higher speed devices is being sent to the lower speed memory device, the lower speed memory device experiences a high bandwidth demand. Because the lower speed memory device is unable to write data at the rate demanded, the data accumulates in the cache system. Thus, the cache system must have enough storage space to temporarily store the data during periods of high bandwidth demand. However, cache memory systems are relatively costly as high speed types of memory are used for the memory storage space of the cache system.

In light of this and other issues, the present specification discloses a memory device which alters its performance characteristics in response to a demand for bandwidth rising above a predetermined threshold. According to certain illustrative examples, a memristive memory device can alter its performance characteristics by changing the resistance levels used to represent high and low resistive states. The memristive memory elements of a memristive memory device may change their resistive state by having a programming voltage applied. By changing the resistance levels used to represent high and low resistive states so that the difference between the two states is smaller, the time it takes to change the state of a memory element is reduced. When the bandwidth demand falls below a predetermined threshold, the memory elements which were written to at different resistive levels may be restored to their full nominal resistive levels.

Additionally or alternatively, certain memory elements within the memory device may be disabled based on their position within the array. Memory elements within a memory device are often placed along a conductive wire referred to as a bit line. In some cases, the number of memory elements along a bit line is equal to a word length. Word length refers to the number of bits which are accessed for each addressable point within the memory array. In a memristive memory device, the memory elements along a particular line which are in a low resistive state add to a parasitic effect which slows down the write process. By setting some of the memory elements along a particular line into a high resistive state and simply not using those memory elements, the write process can be performed at a higher speed. When the demand for bandwidth falls below a predetermined threshold, these memory elements can be enabled. Furthermore, the data which was written during the high bandwidth demand period can be rearranged to free up storage space within the memory device. This procedure also enables the driver circuitry to operate at lower power levels because of an increase in otherwise half selected devices that would now be in a high resistive state.

Through use of a method or system embodying principles described herein, a memory device can change its performance characteristics in response to a demand for bandwidth rising above a predetermined threshold. This change in performance characteristics is such that the speed at which the memory device is able to write data increases. This allows the memory device to effectively adapt to changing load conditions and rely less on costly cache systems.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an embodiment," "an example" or similar language means that a particular feature, structure, or characteristic described in connection with the embodiment or example is included in at least that one embodiment, but not necessarily in other embodiments. The various instances of the phrase "in one embodiment" or similar phrases in various places in the specification are not necessarily all referring to the same embodiment.

Throughout this specification and in the appended claims, the term "full state" refers to the nominal high and low resistive values of memory elements used to represent a digital '1' and a digital '0'. The term "sub-full state" refers to resistive values having a smaller difference between high and low resistive states than the difference between high and low resistive values of full states.

Throughout this specification and in the appended claims, the term "bit line" is to be broadly interpreted as a line in a memory array to which multiple memory elements are connected. A bit line can be used to access a single bit or a set of bits.

Referring now to the figures, FIG. 1 is a diagram showing an illustrative memory system. According to certain illustrative examples, a memory system includes a high speed data source (102), a cache system (104), and a memory device (106) including a memory controller (108) and a memory array (110).

The high speed data source (102) can be any device which transfers data at a rate faster than the memory device (106) is able to write. For example, the high speed data source (102) may be a type of memory which is faster than the memory device (106). The high speed data source may also be a network interface device which receives data over a network at a rate which is faster than the memory device (106) is able to write.

As mentioned above, a cache system (104) can be used as a temporary storage for data being transferred from a high speed data source (102) to a lower speed memory device (106). Cache systems (104) are typically used to bridge the performance gap between such different devices. Through use of a cache system (104), a higher speed device does not need to slow down to write to a lower speed memory device. For example, the main memory of a computing system typically operates at a faster rate than the hard disk drive of the computing system. Through use of a cache system (104), the main memory can transfer data to the hard disk drive at the fast rate without having to slow down to the slower write speed rate of the hard disk drive.

A memory device (106) typically includes both a memory controller (108) and a memory array (110). The memory controller (108) is a digital circuit which manages the flow of data to and from the memory device (106). The memory array (110) is the set of memory elements that actually store the data on the memory device (106). Many types of memory structures can be used to form a memory array (110). Different memory structures have their stored data accessed differently. For example, some memory structures provide access to bits individually. Some memory structures provide access to a set of bits, instead of individual bits. These sets of bits are referred to as words. Additionally, some memory structures provide access to sets of words instead of individual words or bits.

In some cases, a memory structure may use different forms of storage elements or switching mechanisms. For example, a storage element may include a 1T-1R (1 transistor, 1 resistive element), 1D-1R (1 diode, 1 resistive element) and other 2 or more terminal variants which include a memresistive device as the storage element or switching mechanism.

Figure 2:
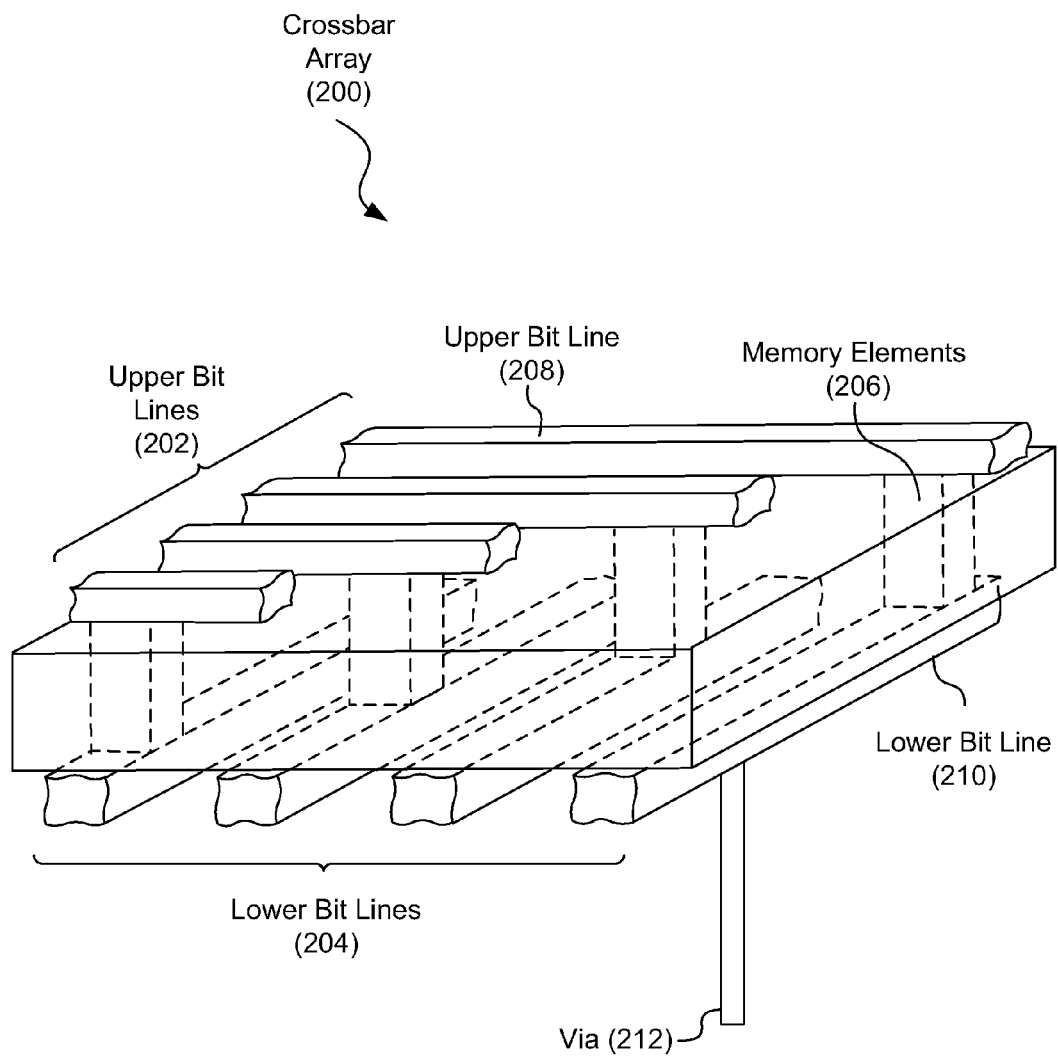
FIG. 2 is a diagram showing an illustrative crossbar memory array, according to one example of principles described herein.

FIG. 2 is a diagram showing an illustrative crossbar memory array (200). According to certain illustrative examples, the crossbar array (200) includes an upper set of bit lines (202) which are generally in parallel. Additionally, a lower set of bit lines (204) is generally perpendicular to, and intersects, the upper set of bit lines (202). Programmable memory elements (206) are disposed at the intersections between an upper bit line (208) and a lower bit line (210).

According to certain illustrative examples, the programmable memory elements (206) may be memristive devices. Memristive devices exhibit a "memory" of past electrical conditions. For example, a memristive device may include a matrix material that contains mobile dopants. These dopants can be moved within a matrix to dynamically alter the electrical operation of the memristive device.

The motion of dopants can be induced by the application of a programming condition such as an applied electrical voltage across a suitable matrix. The programming voltage generates a relatively high electrical field through the memristive matrix and alters the distribution of dopants. After removal of the electrical field, the location and characteristics of the dopants remain stable until the application of another programming electrical field. For example, by changing the dopant configurations within a memristive matrix, the electrical resistance of the device may be altered. The memristive device is read by applying a lower reading voltage which allows the internal electrical resistance of the memristive device to be sensed but does not generate a high enough electrical field to cause significant dopant motion. Consequently, the state of the memristive device may remain stable over long time periods and through multiple read cycles.

According to certain illustrative examples, the crossbar array (200) may be used to form a non-volatile memory array. Each of the programmable memory elements (206) is used to represent one or more bits of data. Although individual bit lines (208, 210) in FIG. 2 are shown with rectangular cross sections, crossbars may also have square, circular, elliptical, or more complex cross sections. The lines may also have many different widths, diameters, aspect ratios and/or eccentricities for an elliptical cross section. The crossbars may be nanowires, sub-microscale wires, microscale wires, or wires with larger dimensions.

According to certain illustrative examples, the crossbar array (200) may be integrated into a Complementary Metal-Oxide-Semiconductor (CMOS) circuit or other conventional computer circuitry. Each individual bit line may be connected to the CMOS circuitry by a via (212). The via (212) may be embodied as an electrically conductive path through the various substrate materials used in manufacturing the crossbar architecture. The CMOS circuitry can provide additional functionality to the memristive device such as input/output functions, buffering, logic, configuration, or other functionality. Multiple crossbar arrays can be formed over the CMOS circuitry to create a multilayer circuit.

A crossbar memory array (200) can be addressed through a number of different methods. For example, one type of addressing scheme involves two coordinates to locate a particular bit or set of bits. One coordinate is used to select an upper bit line (208) and the other coordinate is used to select a lower bit line (210). This type of addressing is referred to as two dimensional (2D) addressing.

In a further example, an addressing scheme can use four coordinates. In such an addressing scheme, a set of switches are connected to a number of row lines intersecting a number of column lines. To set a switch to an ON position, thus selecting an upper bit line (208), the row line and column line connected to that switch are selected. A similar set of switches connected to a different set of row lines and column lines are used to select a lower bit line (210). This type of addressing scheme is referred to as a four dimensional (4D) addressing scheme. A memory device embodying principles described herein can work with the above described addressing schemes as well as other practical addressing schemes.

As mentioned above, memristive devices can be used as non-volatile memory elements. For example, a high resistive state may represent a digital "0" and a low resistive state may represent a digital "1". The process of switching a memristive memory element between a high resistive state and a low resistive state may require a relatively large programming voltage. Consequently, it takes longer to change the state of the memristive memory element. This lowers the write speed capabilities of the memristive memory array. The lower write speed may not be a problem during normal or low peak operation of the memory device. However, during high peak periods when more bandwidth is demanded from the memory array, the lower writing speed can adversely affect the performance of the memory array. As mentioned above, some memory systems can utilize cache systems to act as a buffer. However, cache systems are usually made of high speed types of memory and are thus relatively costly. The present specification discloses a method by which a memory device may alter its performance characteristics in response to the demand for bandwidth rising above a predetermined threshold.

Figure 3A:
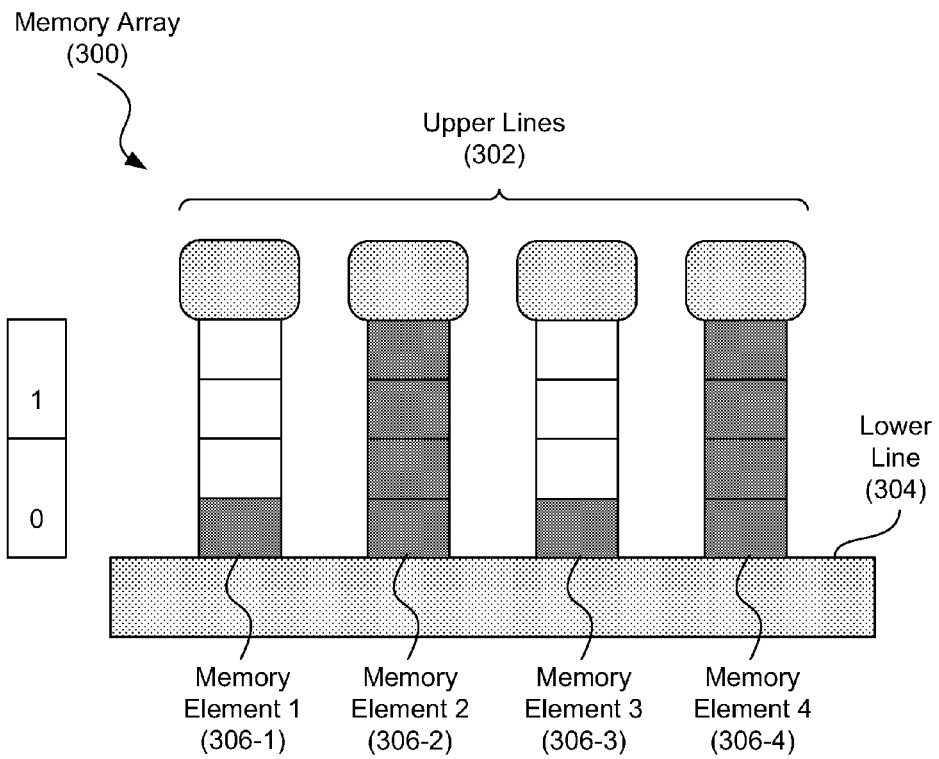
FIG. 3A is a diagram showing an illustrative memory array using full resistive states during normal usage, according to one example of principles described herein.

FIG. 3A is a diagram showing an illustrative memory array during normal usage. According to certain illustrative examples, during low peak operation of the memory array, the memristive memory elements can be set to full ON or OFF states. The term "full" state refers to the resistive levels used to represent the data under normal operating conditions.

FIG. 3A illustrates four memory elements between a lower line (304) and a set of upper lines (302). Memory element 1 (306-1) and memory element 3 (306-3) are in a full high resistive state. Memory element 2 (306-2) and memory element 4 (306-4) are in a full low resistive state.

The full resistive state is illustrated with shaded and non-shaded regions of a memory element. The shaded region represents the portion of the memory element where the mobile dopants are located. The non-shaded region represents the portion of the memory element where no mobile dopants are present. In a high resistive state, the mobile dopants are pushed to one side of the memory element. The mobile dopants act as charge carriers. Thus, if a relatively large portion of the memory element has no mobile dopants, then little electric current will pass through the memristive matrix. In a low resistive state, the mobile dopants are placed across the entire memory element. This allows electric current to flow through the memory element.

The transition between a high resistive state and a low resistive state does not happen instantaneously. In order to move the mobile dopants from one position to another, the programming voltage is applied for a period of time. This period of time affects the rate at which the memory array (300) is able to write data. To increase the speed at which the memory array (300) is able to write data, the memory array (300) can switch to using sub-full resistive states.

Figure 3B:
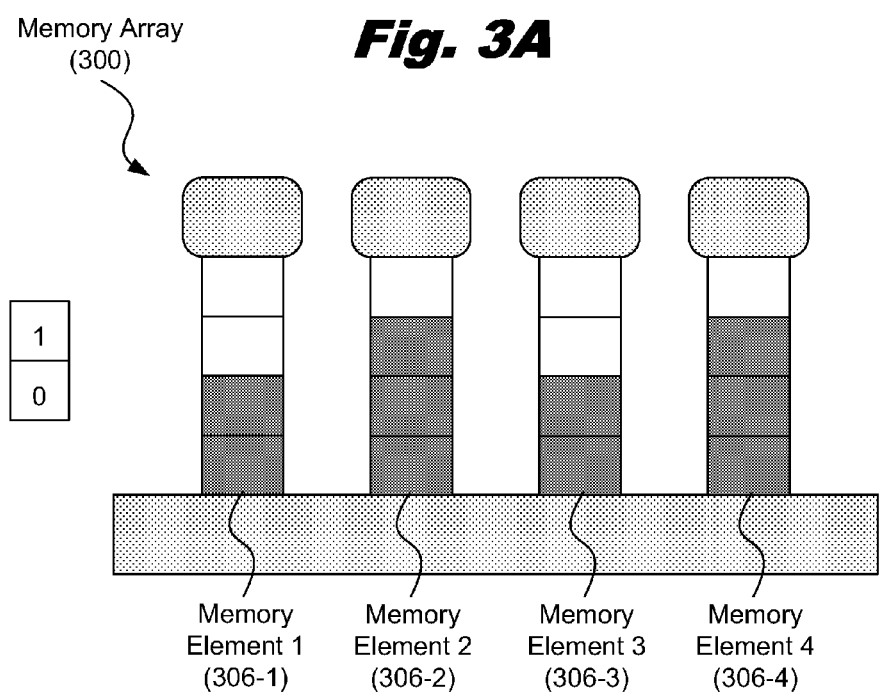
FIG. 3B is a diagram showing an illustrative memory array using sub-full resistive states during high peak usage, according to one example of principles described herein.

FIG. 3B is a diagram showing an illustrative memory array (300) during high peak usage. According to certain illustrative examples, the position of the mobile dopants used to represent a high resistive state and/or a low resistive state can be changed so that the difference in mobile dopant position between the two states is smaller. The ratio of the resistance of a memristive device in a full high resistive state to a full low resistive state can be on the order of $10^4$. Thus, there is room for a reduction in this ratio. These states which have a reduction in margin between the high resistive state and the low resistive state are referred to as "sub-full" states. With the smaller difference between mobile dopant position, less power and/or less time is required to switch the resistive state of a memory element. Consequently, the memory array is then able to write data at a faster rate.

After the high peak period has ended and the bandwidth demand on the memory array falls below a threshold, the memory array can then go through the memory elements which were written to a sub-full state and transition them to a full state. This will help ensure that the memory array maintains its non-volatility.

In some cases, the smaller difference in position between the high state and the low state for the sub-full resistive states may lead to some errors in the data. Various error detection and correction processes are available which may be used to correct these errors.

The shaded and non-shaded regions of the memory elements (306) shown in FIGS. 3A and 3B are not illustrated to scale. The shaded regions do not necessarily indicate the portion of the memristive matrix occupied by mobile dopants. Rather, the shaded regions are used to illustrate the differences between memory elements in full states and sub-full states.

According to certain illustrative examples, in addition to or alternative to the method described above, certain memory elements within a memory array may be disabled during high peak times. The memory elements which are disabled depend on their position within the array. As will be described in more detail below, by disabling some memory elements, the remaining memory elements can be written to at a faster rate. This causes a temporary reduction in the storage capacity of the memory array. However, when the demand for bandwidth on the memory array decreases below a threshold, the disabled memory elements can be re-enabled. Additionally, the data stored may then be moved around to provide efficient storing of data on the memory array.

Figure 4A:
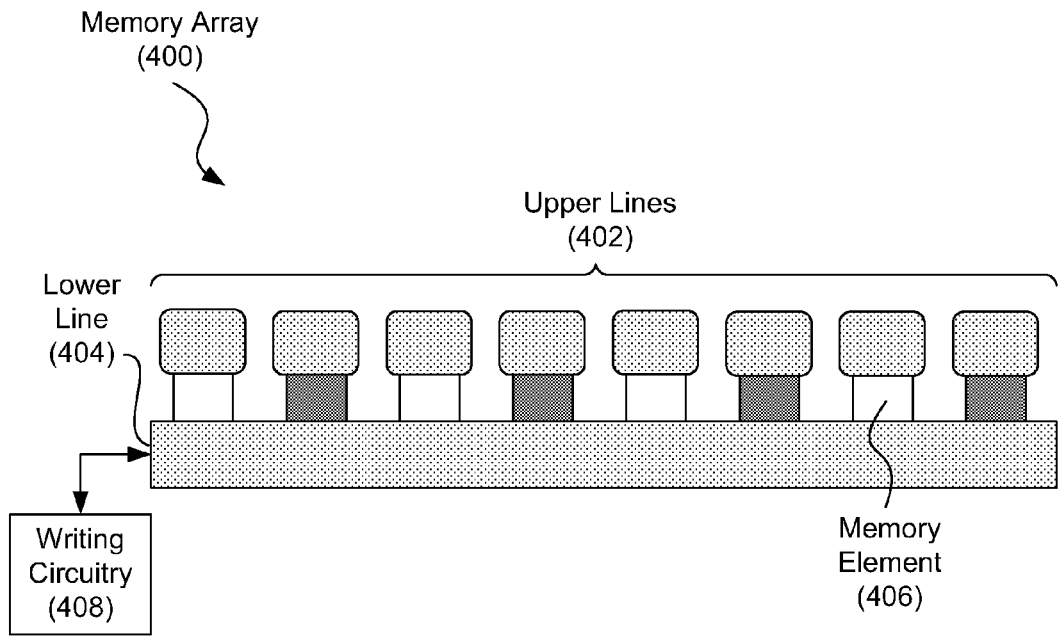
FIG. 4A is a diagram showing an illustrative memory array including a plurality of memory elements along a line during normal usage, according to one example of principles described herein.

FIG. 4A is a diagram showing an illustrative memory array (400) during normal usage. For illustrative purposes, eight memory elements (406) are shown along a single lower line (404). Each memory element is connected to a different upper line (402). A practical memory array (400) may have a greater number of memory elements (406) per line. For example, a practical memory array may have 16, 32, 64, or even more memory elements (406) per line.

According to certain illustrative examples, under normal operating conditions when the bandwidth demanded of the memory array (400) is relatively low, each memory element (406) along a line (404) is used to store data. The more memory elements (406) along a particular line (404), the longer it will take to write to each memory element (406). This is because having more memory elements (406) along a particular line (404) adds to parasitic currents which affect the process of applying the proper programming voltage to set a memory element (406) in the appropriate state.

Figure 4B:
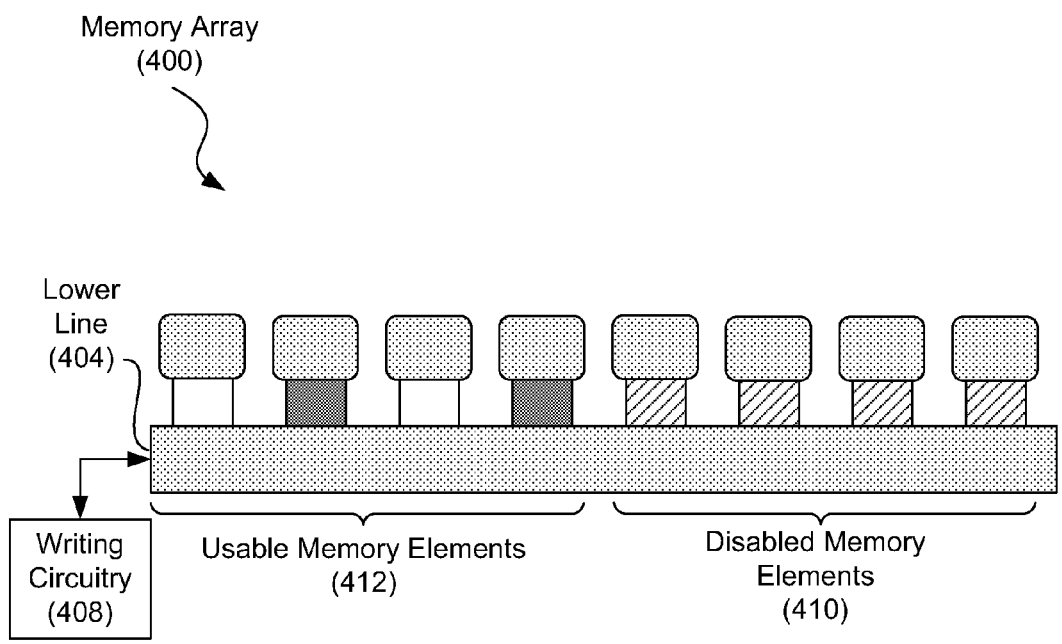
FIG. 4B is a diagram showing an illustrative memory array with a subset of disabled memory elements along a line during high peak usage, according to one example of principles described herein.

FIG. 4B is a diagram showing an illustrative memory array during high peak usage. According to certain illustrative examples, the memory elements on the end of the line farthest from the point at which the writing circuitry connects to the line are disabled when the demand for bandwidth rises above a predetermined threshold. The disabled memory elements (410) can be disabled by setting all of them to a high resistive state. With a subset of the memory elements (406) being disabled, the parasitic currents experienced by the writing circuitry (408) will be reduced. This will allow the writing circuitry to program the usable memory elements (412) in a shorter period of time. Thus, the writing circuitry may operate at a faster rate.

FIG. 4B illustrates a case in which half of the memory elements (406) along a line are disabled. However, a memory device embodying principles described herein may disable any number of memory elements along a line. In general, the more memory elements which are disabled, the faster the writing circuit will be able to write to the remaining usable memory elements (412). However, disabling more memory elements results in a higher temporary reduction of storage space within a memory array.

The disabling of some of the memory elements along a line may be done through a variety of means. For example, the memory controller of the memory array can set which bits within the array should and should not be written. In a further example, driver software running on the physical computing system utilizing the memory device can store data in a manner such that the far bits of a particular line are not used. For example, instead of storing an eight bit value of "10011010" along a single eight bit line, the software may cause the data to be written on two eight bit lines. The first eight bit line may read "10011111" and the second eight bit line may read "10101111". To reconstruct the original data, the driver software combines the first four bits from both of the word lines to get the original eight bit value of "10011010".

The aforementioned example is only one method of constraining the bits along a bit line. Other methods for constrained coding of the storage elements along a bit line which lead to an increase in the overall resistance, or minimize the write times and/or decrease the load on the write circuitry may be used.

Figure 5A:
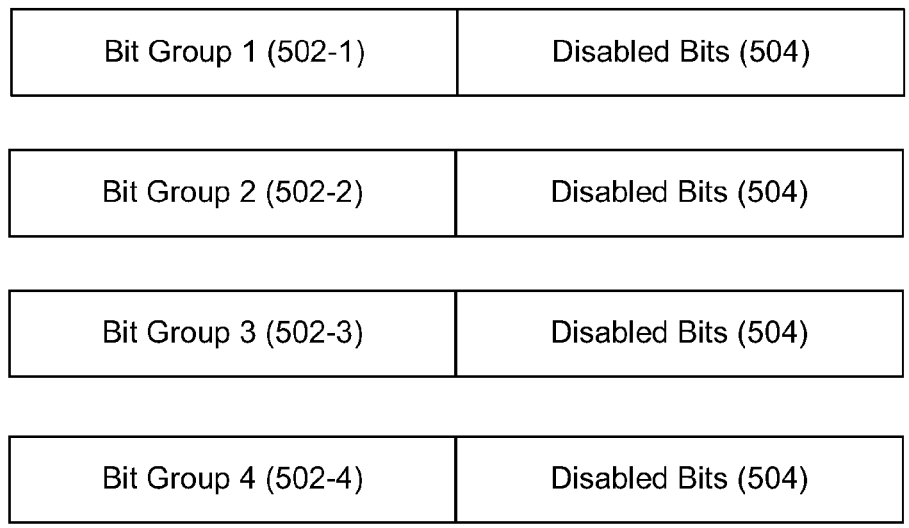
FIGS. 5A and 5B are diagrams showing illustrative bit group placement, according to one example of principles described herein.
Figure 5B:
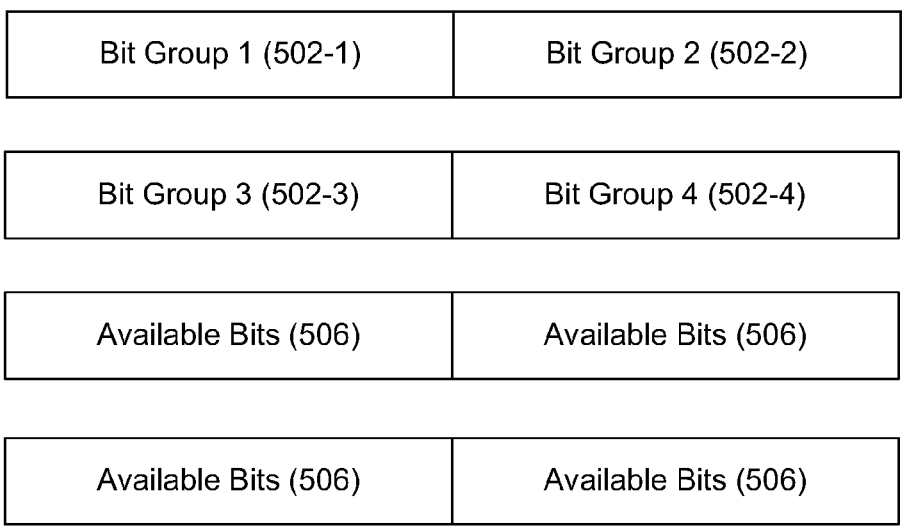

FIGS. 5A and 5B are diagrams showing illustrative bit group placement (500). According to certain illustrative examples, data written to the memory array during the high peak mode is rearranged when the bandwidth demand on the memory device falls below a predetermined threshold. This rearrangement of data will free up storage space which was used by the disabled memory elements (e.g. 412, FIG. 4). The threshold at which the bandwidth falls below to trigger the rearranging of data is not necessarily the same as the threshold at which the bandwidth rises above to trigger the disabling of bits.

FIG. 5A is a diagram showing four lines in which data has been written during a high bandwidth demand mode. Consequently, each bit line includes memory elements which have been disabled (504). The four bit groups (502-1 to 502-4) represent valid data which have been stored on the usable bits (e.g. 410, FIG. 4) of the lines during a high bandwidth demand mode.

FIG. 5B is a diagram illustrating the bit lines of FIG. 5A after the data has been rearranged to free up space. Bit group 2 (502-2) has been moved up to the bit line with bit group 1 (502-1). Additionally, bit group 3 (502-3) and bit group 4 (502-4) have been moved up to the line where bit group 2 (502-2) used to be. This process leaves two full bit lines available (506). By freeing up the bit lines, more storage space on the memory array is made available.

FIG. 6 is a flowchart showing an illustrative method of adjusting the performance characteristics of a storage device. According to certain illustrative embodiments, the method includes, in response to a memory device experiencing a demand for bandwidth above a threshold, writing memory elements of the memristive memory device at lower resistive state levels than standard resistive state levels used to represent data on the memory device (block 502); in response to the memory device experiencing a demand for bandwidth above a threshold, disabling a subset of bits along a word line by setting the subset of bits in a high resistive state, the subset of bits on a far end of the word line (block 504); in response to the demand for bandwidth falling below the threshold, rewriting the memory elements which were written at the low resistive state levels to the standard resistive state levels (block 506); and in response to the demand for bandwidth falling below the threshold, enabling the subset of bits along the word line (block 508).

In conclusion, through use of a method or system embodying principles described herein, a memory device can change its performance characteristics in response to a demand for bandwidth rising above a predetermined threshold. This change in performance characteristics is such that the speed at which the memory device is able to write data increases. This allows the memory device to effectively adapt to changing load conditions and rely less on costly cache systems.

The preceding description has been presented only to illustrate and describe embodiments and examples of the principles described. This description is not intended to be exhaustive or to limit these principles to any precise form disclosed. Many modifications and variations are possible in light of the above teaching.

What is claimed is:

1. A memory device comprising:
   a memory array comprising memory elements arranged in an array; and
   a memory controller for altering a performance characteristic of the memory array to increase a rate at which the memory elements of the array store data being written to the memory array in response to the memory array experiencing a demand for bandwidth above a threshold,
   wherein the memory array comprises memristive memory elements.

2. The device of claim 1, in which to alter said performance characteristic of said memory array, said memory elements are written at sub-full resistive states.

3. The device of claim 2, in which said memory controller rewrites said memory elements which were written at said sub-full resistive states to full resistive states in response to said demand for bandwidth falling below said threshold.

4. The device of claim 3, in which said memory controller applies an error correction function to data stored in said memory array.

5. A method for automatic adjustment of a memory device, said method comprising:
- altering a performance characteristic of said memory device in response to said memory device experiencing a demand for bandwidth above a threshold, said memory device comprising an array of memory elements to which data can be written at a particular rate;
- in which altering said performance characteristic increases said rate at which said memory device writes data to said array of memory elements,
- wherein said memory device comprises memristive memory elements.

6. The method of claim 5, in which altering said performance characteristic of said memory device comprises writing memory elements at sub-full resistive states, said sub-full resistive states having a smaller difference between high and low resistive states than do full resistive states.

7. The method of claim 6, further comprising rewriting said memory elements which were written at said sub-full resistive state levels to said full resistive states in response to said demand for bandwidth falling below said threshold.

8. The method of claim 7, further comprising performing an error correction function on said memory device.

9. A method for operating a memristive memory device, the method comprising:
- in response to said memristive memory device experiencing a demand for bandwidth above a threshold:
  - writing data to an array of memory elements of said memristive memory device at lower resistive state levels than standard resistive state levels used to represent data on said memristive memory device; and
  - disabling a subset of memory elements along a line of said array of memory elements by setting said subset of memory elements to a high resistive state, said subset of memory elements being located on a far end of said line away from writing circuitry associated with said line;
- in which writing data to said array of memory elements at lower resistive state levels and disabling said subset of memory elements allow data to be written to said memristive memory device at a faster rate.

* * * * *